(12) United States Patent
Kaplan

(10) Patent No.: US 7,649,485 B1
(45) Date of Patent: Jan. 19, 2010

(54) MULTI-RATE ANALOG TO DIGITAL CONVERTER WITH PROPORTIONAL FILTER BANK

(75) Inventor: Todd Kaplan, Grass Valley, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/128,253

(22) Filed: May 28, 2008

(51) Int. Cl.
   *H03M 1/12* (2006.01)
(52) U.S. Cl. ................................ 341/155; 341/160
(58) Field of Classification Search .......... 341/150–160
   See application file for complete search history.

(56) References Cited

U.S. PATENT DOCUMENTS

| | | | |
|---|---|---|---|
| 5,294,926 A | | 3/1994 | Corcoran |
| 5,561,424 A | * | 10/1996 | Norsworthy et al. ........ 341/126 |
| 5,568,142 A | | 10/1996 | Velasquez et al. |
| 6,476,749 B1 | | 11/2002 | Yeap et al. |
| 7,119,724 B1 | * | 10/2006 | Asami ........................ 341/118 |
| 2003/0020644 A1 | | 1/2003 | Yeap et al. |

\* cited by examiner

*Primary Examiner*—Lam T Mai
(74) *Attorney, Agent, or Firm*—Ladas & Parry

(57) ABSTRACT

A system for converting a continuous-time analog signal having a signal bandwidth to a discrete-time digital signal, the system includes a plurality of proportional filters configured to receive the continuous-time analog signal, each proportional filter having a different center frequency from all other proportional filters and each proportional filter having an operational bandwidth directly proportional to its center frequency, and a plurality of sample and hold circuits, each sample and hold circuit coupled to a respective one of the proportional filters.

20 Claims, 4 Drawing Sheets

MULTI-RATE ANALOG TO DIGITAL CONVERTER WITH PROPORTIONAL FILTER BANK

TECHNICAL FIELD

This disclosure relates to analog to digital converters, and in particular to analog to digital converters that use a filter bank.

BACKGROUND

Analog to digital converters with sufficient dynamic range and linearity become increasingly difficult to implement as the sampling rates increase. Improving the performance of wideband analog to digital converters is a long standing problem and a number of approaches have been developed to address this issue. One approach in the prior art is to use time interleaved analog to digital converters, which are exemplified by U.S. Pat. No. 5,294,926 to Corcoran, issued Mar. 15, 1994. In that approach the signal is fed to a bank of analog to digital converters and the sampling of the signal is time interleaved between the analog to digital converters (ADC) so that the first sample is taken by the first ADC, the second sample by the second ADC and so on until the last ADC takes a sample and then the sampling order repeats starting with the first ADC. The samples from the ADCs are then recombined. The sample rate of any one of the analog to digital converters is reduced; however, mismatches between the analog to digital converters can cause amplitude and phase errors.

Another approach is use a filter bank to filter the wideband input signal into a set of lower bandwidth input signals. The lower bandwidth input signals can then be converted to digital form with ADCs operating at lower sample rates and then the outputs from the ADCs are recombined. The filter bank approach for reducing ADC sample rates is exemplified by U.S. Pat. No. 5,568,142 to Velazquez et al. issued Oct. 22, 1996 and by U.S. Pat. No. 6,476,749 to Yeap et al. issued Nov. 5, 2002.

Such a system for analog to digital conversion 10 is shown in FIG. 1. The wideband input signal 12 is fed into filters 14, which subdivide the wideband input signal 12 into a set of lower bandwidth signals that are each then fed into sample and hold circuits 16 and then to analog to digital converters 18. The outputs of the analog to digital converters 18 are digitally recombined in digital recombiner 20 to form a digital output 22, which is the digital representation of input signal 12.

In the prior art the filters 14 have different center frequencies to cover the bandwidth of the wideband input signal; however, each filter 14 has the same operational bandwidth. This has the advantage that the hardware downstream of each filter 14 is identical including the sample and hold circuit 16 and the ADC 18. Because all of the operational bandwidths of the filters 14 are identical, each sample and hold circuit 16, as shown in FIG. 1, is clocked at the same rate.

A disadvantage of the prior art system is that capacitors in the sample and hold circuits 16 may see large signal swings and if, as a result, the sample and hold circuits 16 cannot react fast enough to the large signal swings the sample and hold circuit 16 will introduce errors that effectively limit the performance of the analog to digital conversion system. Because the performance of the sample and hold circuits 16 is a major limiter to the performance of the filter bank approach for wideband analog to digital conversion, any improvement to the performance of the sample and hold circuits 16 can help improve the signal to noise ratio and the signal to noise plus distortion ratio of the analog to digital conversion system.

What is needed is a system that improves the performance of the sample and hold circuits or limits large signal swings at the input of the sample and hold circuits. If the stress on the sample and hold circuits can be limited then the performance of the analog the digital conversion system can be improved. The embodiments of the present disclosure answer these and other needs.

SUMMARY

In a first embodiment disclosed herein, a system for converting a continuous-time analog signal having a signal bandwidth to a discrete-time digital signal includes a plurality of proportional filters configured to receive the continuous-time analog signal, each respective one of the proportional filters having a different center frequency from all other proportional filters and each respective one of the proportional filters having an operational bandwidth directly proportional to its center frequency, and a plurality of sample and hold circuits, each respective one of the sample and hold circuits coupled to a respective one of the proportional filters.

In another embodiment disclosed herein, a method for converting a continuous-time analog signal having a signal bandwidth to a discrete-time digital signal includes filtering the continuous-time analog signal with a plurality of proportional filters configured to receive the continuous-time analog signal, each respective one of the proportional filters having a different center frequency from all other proportional filters and each respective proportional filter having an operational bandwidth directly proportional to its center frequency, and sampling and holding an output of each respective one of the proportional filters with a respective one of a plurality of sample and hold circuits, each respective one of the sample and hold circuits coupled to a respective one of the proportional filters.

These and other features and advantages will become further apparent from the detailed description and accompanying figures that follow. In the figures and description, numerals indicate the various features, like numerals referring to like features throughout both the drawings and the description.

DETAILED DESCRIPTION

Figure 1:
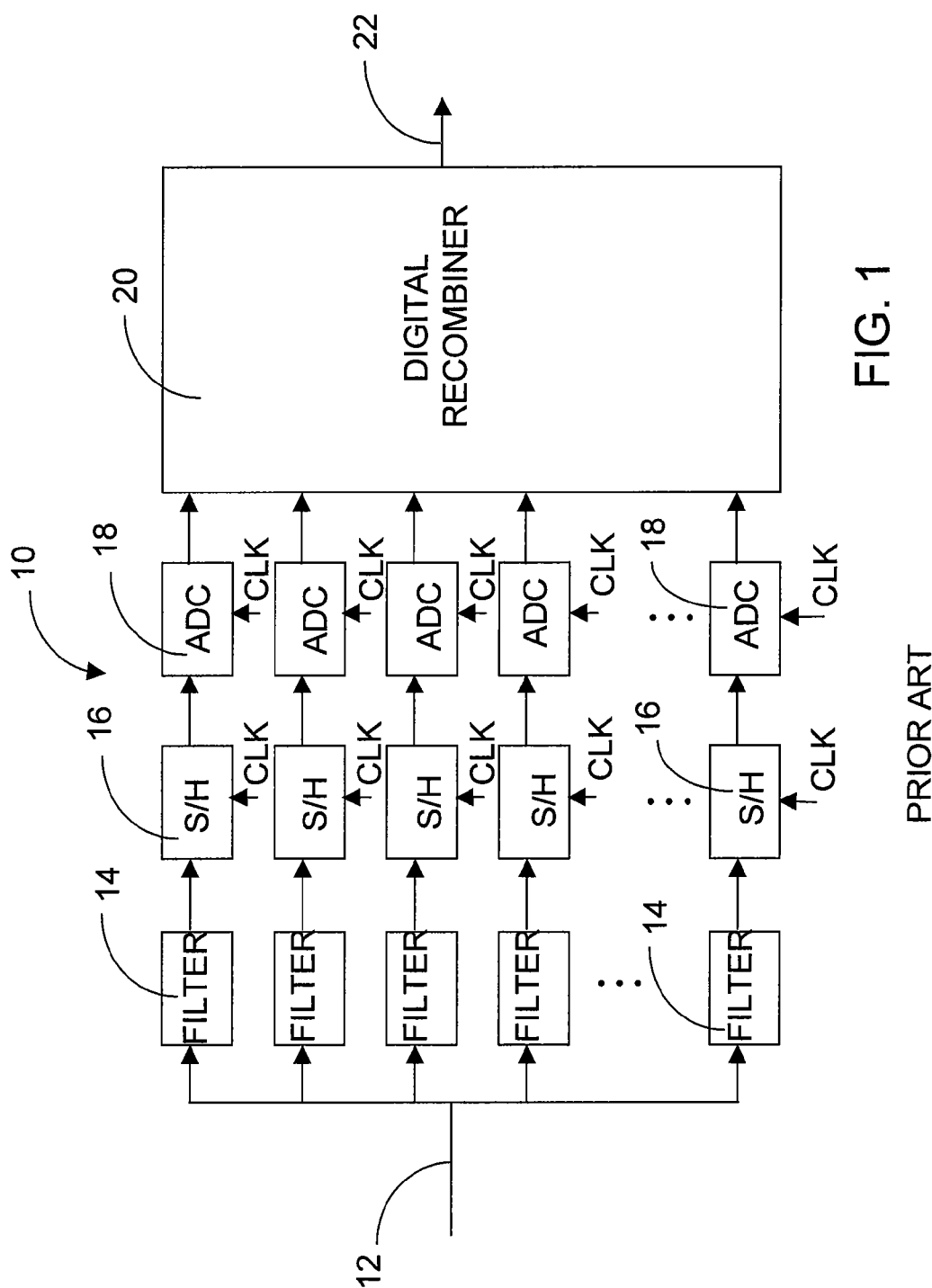
FIG. 1 is a schematic depiction of a system for analog to digital conversion in accordance with the prior art.
Figure 2:
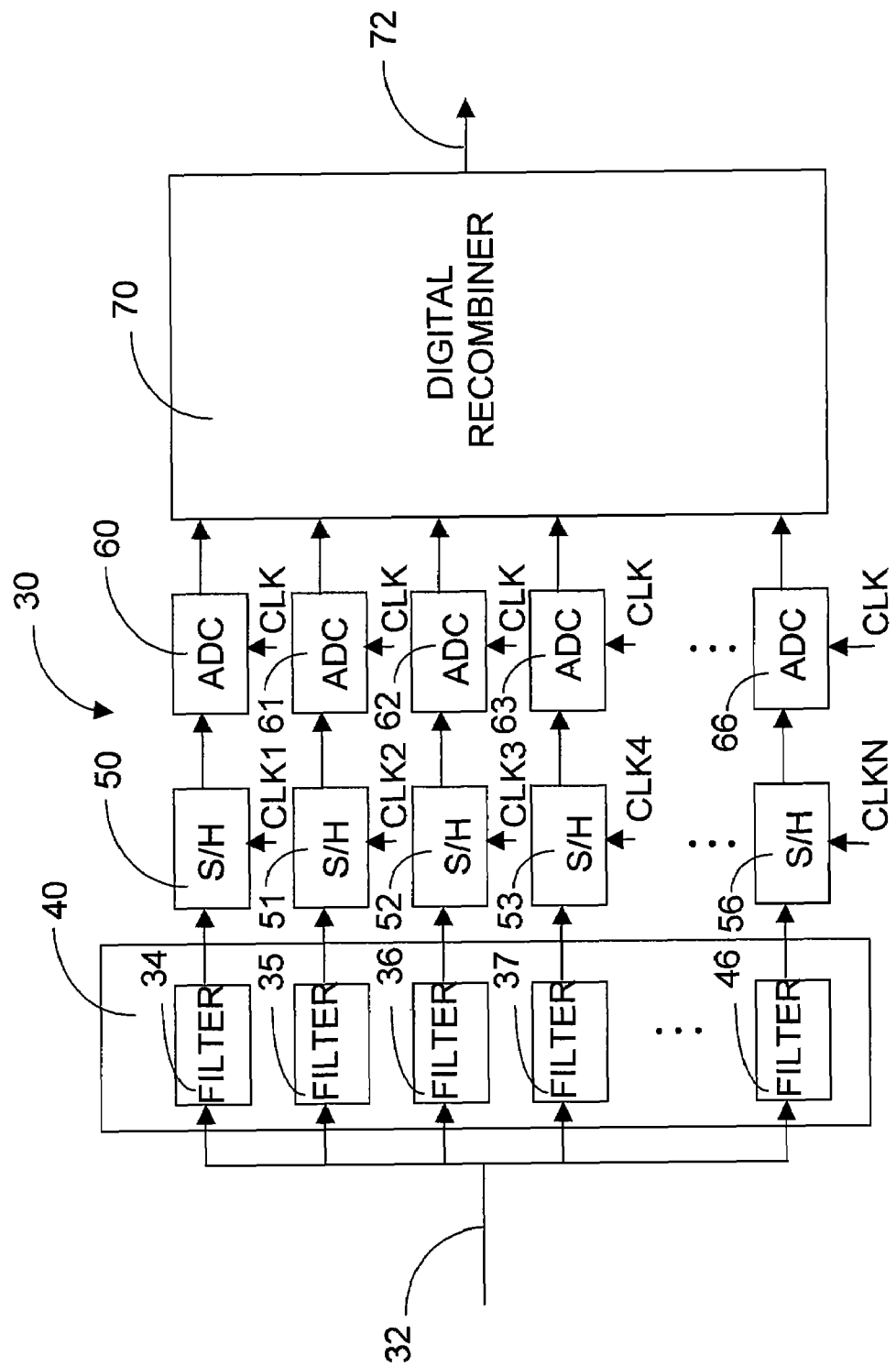
FIG. 2 is a schematic depiction of a system for analog to digital conversion in accordance with the present disclosure.

Referring to FIG. 2, a system 30 for analog to digital conversion is shown. A wideband input signal 32 is fed into a filter bank 40 with a set of proportional filters 34, 35, 36, 37 . . . and 46, the number of which depend on the application. In FIG. 2 the individual proportional filters are shown as filters 34, 35, 36, 37 . . . and 46. Each of these filters has a different center frequency; however, in contrast to the prior art, the operational bandwidth of each of the filters is directly proportional to the center frequency of the filter, and thus the filters are proportional filters 34, 35, 36, 37 . . . and 46. The operational bandwidth of a proportional filter is wider for a high center frequency and lower for a low center frequency of the proportional filter, thus the filters are proportional filters 34, 35, 36, 37 . . . and 46. The center frequencies and the operational bandwidth of the proportional filters 34, 35, 36, 37 . . . and 46 are such that the sum of the operational bandwidths of the proportional filters 34, 35, 36, 37 . . . and 46 is at least equal or greater than the bandwidth of the wideband signal input 32.

Because the operational bandwidths of the each of the proportional filters 34, 35, 36, 37 . . . and 46 in the filter bank 40 vary, the clock rates (CLK1, CLK2, CLK 3, CLK 4 . . . and CLK N) of the sample and hold circuits 50, 51, 52, 53 . . . and 56 also vary, and depend on the operational bandwidth of the proportional filter to which the sample and hold circuit is connected. In one embodiment, as discussed further below, the clock rate of each sample and hold circuit is substantially the same as the center frequency of the proportional filter to which the sample and hold circuit is connected.

The analog to digital converters 60, 61, 62, 63 . . . and 66 that follow the sample and hold circuits 50, 51, 52, 53 . . . and 56 may be clocked at the same rate as the sample and hold circuit to which they are connected. However, the analog to digital converters 60, 61, 62, 63 . . . and 66 may also oversample or under sample the sample and hold circuit outputs. The outputs of the analog to digital converters 60, 61, 62, 63 . . . and 66 are digitally recombined by the digital recombiner 70 to form the digital output 72.

The clock signals may be chosen to be submultiples of a master clock so they can be easily generated on chip and retimed to reduce jitter.

Figure 3:
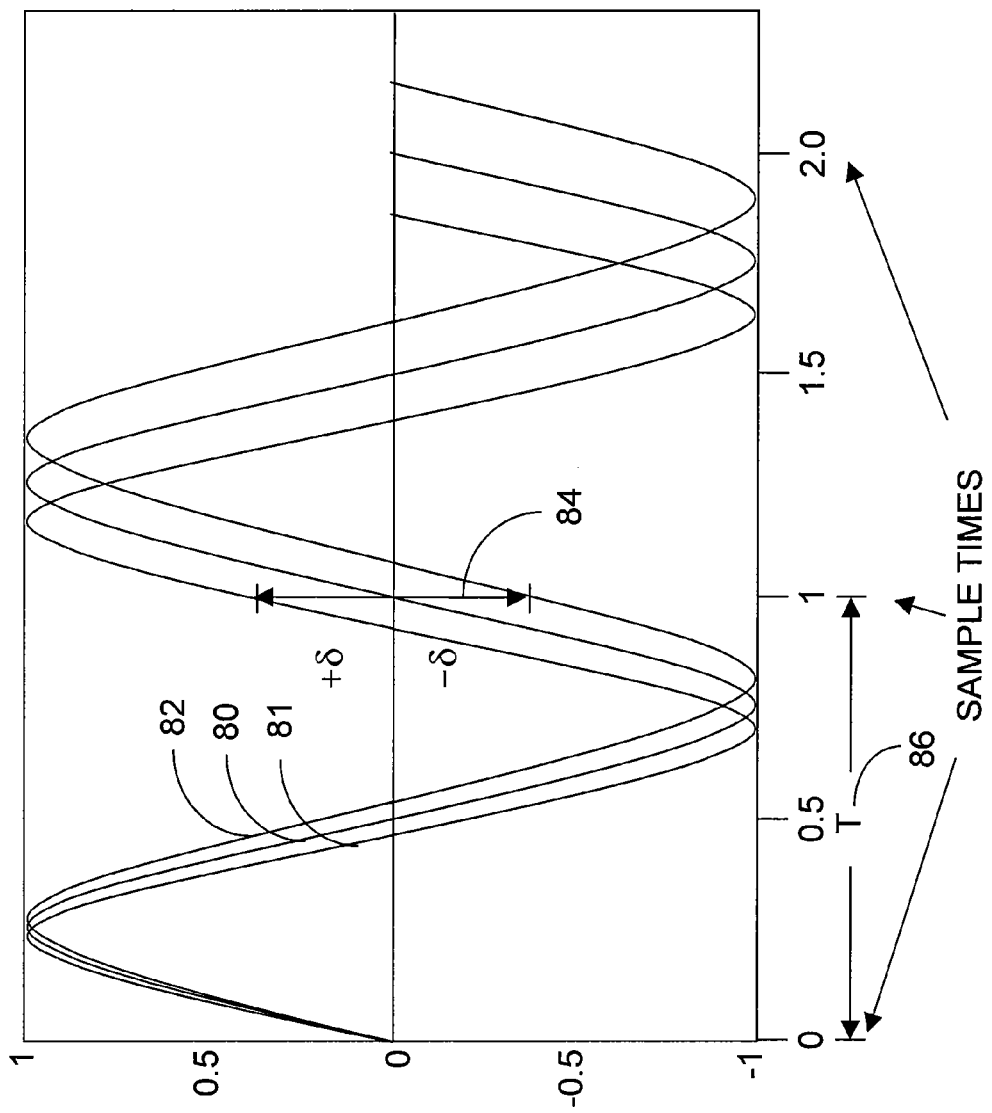
FIG. 3 is diagram showing the sampling of input sine waves in accordance with the present disclosure.

To improve the sample and hold circuit performance in this system, the signal swings at the input to the sample and hold circuits 50, 51, 52, 53 . . . and 56 are preferably limited. Referring to FIG. 3, a sine wave 80 having a frequency f is sampled by a sample and hold circuit at a periodic interval of T or a rate of 1/T. If the sample time 86 is chosen to be T=N/f, where N=0, 1, 2, . . . , then the sine wave 80 having a frequency of f will be continually sampled at the same point on the sine wave. However, sine waves with different frequencies will not. By limiting the operational bandwidth of the proportional filter coupled to and preceding the sample and hold circuit, the signal swings at the input to the sample and hold circuit can be limited to +/−δ as shown by reference 84 in FIG. 3. For example, sine wave 81 has a frequency of f−Δf and sine wave 82 has a frequency of f+Δf. If a sampling of sine wave 81 is followed by a sampling of sine wave 82, then the two succeeding samples will have at most a 2δ amplitude signal swing. So by setting the bandwidth of the proportional filter feeding this sample and hold circuit to be 2Δf or in radians per second 2Δω, the signal swing at the input to the sample and hold circuit can be limited to a 2δ signal swing.

Assuming an amplitude of 1, $$2\delta = \sin[(w+\Delta w)T] - \sin[(\omega-\Delta w)T]. \tag{1}$$

Letting $$T \cong \frac{2N\pi}{\omega}, N = 0, 1, 2, 3 \ldots \tag{2}$$

and using trigonometric identities sin(a+b)=sin(a)cos(b)+cos(a)sin(b), we can solve (1) to obtain $$\delta = \sin\left(2N\pi\frac{\Delta\omega}{\omega}\right). \tag{3}$$

If δ is restricted to be small, then by using sin(x)=~x, the following equation is obtained $$\Delta\omega \cong \frac{\delta\omega}{2N\pi}. \tag{4}$$

Equation (4) indicates that the filter bank 40 is a bank of proportional filters 34, 35, 36, 37 . . . and 46, because Δω, which is the bandwidth of the proportional filter, is directly proportional to ω, which is the center frequency of the proportional filter. Equation (2) indicates that the sample rates for the sample and hold circuits 50, 51, 52, 53 . . . and 56 depend on the center frequencies of each proportional filter and are higher for sample and hold circuits 50, 51, 52, 53 . . . and 56 connected to proportional filters 34, 35, 36, 37 . . . and 46 with a high center frequency and lower for sample and hold circuits 50, 51, 52, 53 . . . and 56 connected to proportional filters 34, 35, 36, 37 . . . and 46 with lower center frequencies.

Figure 4:
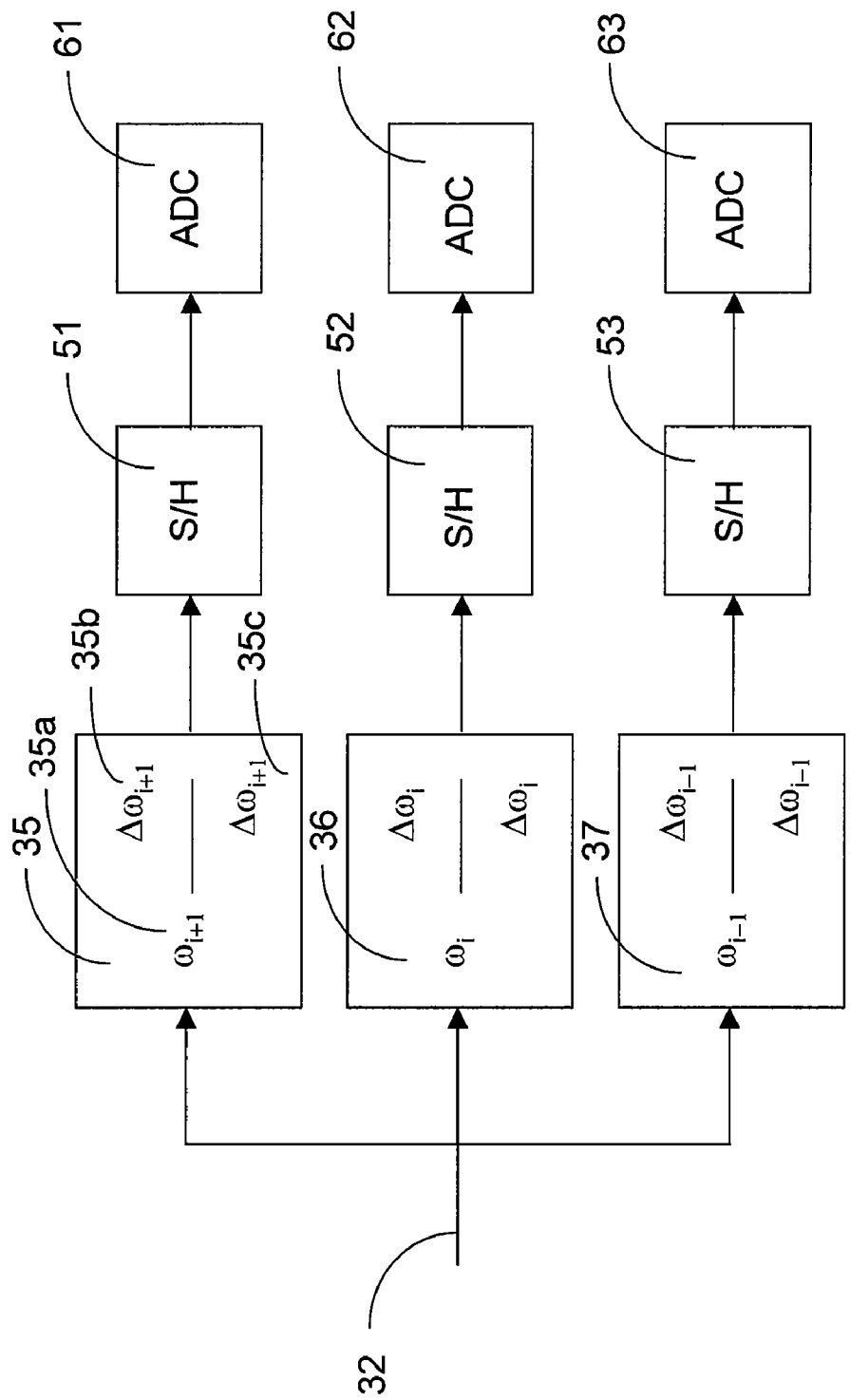
FIG. 4 is portion of a filter bank in accordance with the present disclosure.

FIG. 4 shows a portion of the filter bank 40 of proportional filters 34, 35, 36, 37 . . . and 46 connected to sample and hold circuits 50, 51, 52, 53 . . . and 56 and analog to digital converters 60, 61, 62, 63 . . . and 66. Each proportional filter is shown with its center frequency and its operational bandwidth. For example, proportional filter 35 has a center frequency 35a of $\omega_{i+1}$ and an operational bandwidth of 35a plus 35b for a total operational bandwidth for proportional filter 35 of $2\Delta\omega_{i+1}$. From FIG. 4, $$\omega_{i+1} = \omega_i - \Delta\omega_i - \Delta\omega_{i-1} \tag{5}$$

Using (4), $$\omega_{i-1} = \omega_i - \frac{\delta\omega_i}{2N\pi} - \frac{\delta\omega_{i-1}}{2N\pi} \tag{6}$$

which can be solved as:

$$\omega_{i-1} = \omega_i \frac{1 - \frac{\delta}{2N\pi}}{1 + \frac{\delta}{2N\pi}}. \tag{7}$$

The center frequency for the proportional filter with the highest center frequency for a wideband input signal with bandwidth of Fs/2 above DC, can be expressed as $$\omega_N = 2\pi F_s/2 - \Delta\omega_N. \tag{8}$$

Then from (4), $$\omega_N = \frac{\pi F_s}{1 + \frac{\delta}{2N\pi}} \tag{9}$$

Equation (2) can be used to solve for the sample time $T_i$.

$$T_{i-1} = T_i \frac{1 + \frac{\delta}{2N\pi}}{1 - \frac{\delta}{2N\pi}} \quad (10)$$

Equations (2) through (10) describe how to set the filter bandwidths and sample times based on a desired value of δ. In practice, it is not always straightforward to obtain ideal ratios of sample times. For this reason, a desired fraction $f=T_i/T_{i+1}$ can be used to solve for δ in equation (10) to obtain $$\delta = 2N\pi \frac{1-f}{1+f}. \quad (11)$$

This system of analog to digital conversion improves the performance of the sample and hold circuits 50, 51, 52, 53 . . . and 56, which leads to improved overall performance of the analog to digital conversion system 10.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. A system for converting a continuous-time analog signal having a signal bandwidth to a discrete-time digital signal, the system comprising:
a plurality of proportional filters configured to receive the continuous-time analog signal, each respective one of the proportional filters having a different center frequency from all other proportional filters and each respective one of the proportional filters having an operational bandwidth directly proportional to its center frequency; and
a plurality of sample and hold circuits, each respective one of the sample and hold circuits coupled to a respective one of the proportional filters.

2. The system of claim 1 wherein a ratio of the operational bandwidth to the center frequency of each respective one of the proportional filters is the same for all of the proportional filters.

3. The system of claim 1 further comprising:
a plurality of analog to digital converters, each respective one of the analog to digital converters coupled to a respective one of the sample and hold circuits; and
a digital recombiner coupled to all of the analog to digital converters and configured to combine an output from each respective one of the sample and hold circuits;
wherein each respective one of the sample and hold circuits is driven by a respective clock signal, the respective clock signal having a frequency proportional to the center frequency of the respective one of the proportional filters to which the respective sample and hold circuit is coupled.

4. The system of claim 1 wherein the center frequency of a first respective one of the proportional filters approximately equals the center frequency of a second respective one of the proportional filters minus a sum of half of the operational bandwidth of the first respective proportional filter and half of the operational bandwidth of the second respective proportional filter.

5. The system of claim 1 wherein a sum of the operational bandwidths of the plurality of proportional filters is at least as great as the signal bandwidth of the continuous-time analog signal.

6. The system of claim 1 wherein each respective one of the sample and hold circuits is driven by a respective first clock signal, the respective first clock signal having a frequency proportional to the center frequency of the respective one of the proportional filters to which the respective sample and hold circuit is coupled.

7. The system of claim 6 further comprising:
a plurality of analog to digital converters, each respective one of the analog to digital converters configured to receive an output of a respective one of the sample and hold circuits; and
a digital recombiner coupled to all of the analog to digital converters and configured to combine an output from each respective one of the sample and hold circuits;
wherein each respective one of the analog to digital converters is driven by a respective second clock signal, the respective second clock signal having a frequency proportional to the center frequency of the respective one of the proportional filters coupled to the respective sample and hold circuit that is coupled to the respective analog to digital converter.

8. The system of claim 7 wherein each respective second clock signal has a frequency equal to the frequency of the respective first clock signal that drives the respective sample and hold circuit to which the respective analog to digital converter is coupled.

9. The system of claim 1 wherein each respective one of the proportional filters has an operational bandwidth approximately equal to a factor less than unity multiplied by twice the center frequency of the respective proportional filter.

10. The system of claim 9 wherein the factor is less than 0.5.

11. A method for converting a continuous-time analog signal having a signal bandwidth to a discrete-time digital signal, the method comprising:

filtering the continuous-time analog signal with a plurality of proportional filters configured to receive the continuous-time analog signal, each respective one of the proportional filters having a different center frequency from all other proportional filters and each respective proportional filter having an operational bandwidth directly proportional to its center frequency; and sampling and holding an output of each respective one of the proportional filters with a respective one of a plurality of sample and hold circuits, each respective one of the sample and hold circuits coupled to a respective one of the proportional filters.

12. The method of claim 11 wherein a ratio of the operational bandwidth to the center frequency of each respective one of the proportional filters is the same for all of the proportional filters.

13. The method of claim 11 further comprising:

converting an output signal of each respective one of the sample and hold circuits to digital form with a respective one of a plurality of analog to digital converters, each respective one of the analog to digital converters coupled to a respective one of the sample and hold circuits;

combining an output from each respective one of the sample and hold circuits; and driving each respective one of the sample and hold circuits by a respective clock signal, the respective clock signal for a respective sample and hold circuit having a frequency proportional to the center frequency of the respective one of the proportional filters to which the respective sample and hold circuit is coupled.

14. The method of claim 11 wherein the center frequency of a first respective one of the proportional filters approximately equals the center frequency of a second respective one of the proportional filters minus a sum of half of the operational bandwidth of the first respective proportional filter and half of the operational bandwidth of the second respective proportional filter.

15. The method of claim 11 wherein a sum of the operational bandwidths of the plurality of proportional filters is at least as great as the signal bandwidth of the continuous-time analog signal.

16. The method of claim 11 further comprising:

driving each respective one of the sample and hold circuits by a respective first clock signal, the respective first clock signal for a respective sample and hold circuit having a frequency proportional to the center frequency of the respective one of the proportional filters to which the respective sample and hold circuit is coupled.

17. The method of claim 16 further comprising:

converting an output signal of each respective one of the sample and hold circuits to digital form with a respective one of a plurality of analog to digital converters, each respective one of the analog to digital converters coupled to a respective one of the sample and hold circuits;

combining an output from each respective one of the sample and hold circuits; and driving each respective one of the analog to digital converters by a respective second clock signal, the respective second clock signal for a respective analog to digital circuit having a frequency proportional to the center frequency of the respective one of the proportional filters coupled to the respective sample and hold circuit to which the respective analog to digital converter is coupled.

18. The system of claim 17 wherein each respective second clock signal has a frequency equal to the frequency of the respective first clock signal that drives the respective sample and hold circuit to which the respective analog to digital converter is coupled.

19. The method of claim 11 wherein each proportional filter has an operational bandwidth approximately equal to a factor less than unity multiplied by twice the center frequency of the proportional filter.

20. The method of claim 19 wherein the factor is less than 0.5.

* * * * *